United States Patent
McMillan et al.

(10) Patent No.: US 7,954,007 B2
(45) Date of Patent: May 31, 2011

(54) DETECTING FAULTY CPU HEAT SINK COUPLING DURING SYSTEM POWER-UP

(75) Inventors: Henry G. McMillan, Raleigh, NC (US); Christopher C. Moody, Durham, NC (US); Challis L. Purrington, Raleigh, NC (US); Terry L. Sawyers, Raleigh, NC (US); Michael L. Scollard, Raleigh, NC (US); Richard P. Southers, Durham, NC (US); Troy S. Voytko, Apex, NC (US); Christopher C. West, Raleigh, NC (US); Christopher L. Wood, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 1255 days.

(21) Appl. No.: 11/551,961

(22) Filed: Oct. 23, 2006

(65) Prior Publication Data

US 2008/0154536 A1    Jun. 26, 2008

(51) Int. Cl.
*G06F 11/00* (2006.01)
(52) U.S. Cl. .................................................. 714/31
(58) Field of Classification Search .................. 714/31
See application file for complete search history.

(56) References Cited

U.S. PATENT DOCUMENTS

| | | | |
|---|---|---|---|
| 5,491,610 A | | 2/1996 | Mok et al. |
| 6,349,269 B1* | | 2/2002 | Wallace, Jr. .................. 702/132 |
| 6,577,146 B2 | | 6/2003 | Gamache et al. |
| 6,842,718 B2 | | 1/2005 | Byrd et al. |
| 7,141,953 B2* | | 11/2006 | Cohen et al. .................. 318/806 |
| 7,275,248 B2* | | 9/2007 | Nishida ......................... 718/100 |
| 7,574,321 B2* | | 8/2009 | Kernahan et al. ............. 702/179 |
| 7,607,828 B2* | | 10/2009 | Beier et al. .................... 374/163 |
| 2002/0087904 A1* | | 7/2002 | Cai ............................... 713/322 |
| 2003/0063437 A1* | | 4/2003 | Kurihara ....................... 361/688 |
| 2004/0006721 A1* | | 1/2004 | Getz et al. ..................... 713/600 |
| 2005/0068053 A1 | | 3/2005 | Conti et al. |
| 2006/0122740 A1* | | 6/2006 | Law et al. ..................... 700/300 |
| 2007/0097620 A1* | | 5/2007 | Leech et al. .................. 361/687 |
| 2008/0155288 A1* | | 6/2008 | Cai ............................... 713/322 |
| 2008/0215901 A1* | | 9/2008 | Beard ........................... 713/300 |

FOREIGN PATENT DOCUMENTS

| | | |
|---|---|---|
| JP | 6038544 A | 2/1994 |
| JP | 8174895 A | 7/1996 |

* cited by examiner

*Primary Examiner* — Bryce P Bonzo
(74) *Attorney, Agent, or Firm* — Cynthia Seal; Hoffman Warnick LLC

(57) ABSTRACT

The present invention is directed to the detection of faulty CPU heat sink coupling during system power-up. A method in accordance with an embodiment of the present invention includes: monitoring a slope of a CPU temperature rise from initial system power-up; determining if the slope of the CPU temperature rise exceeds an expected value; and in the case that the slope of the CPU temperature rise exceeds the expected value, indicating an existence of a possible fault (PFA) related to a heat sink coupled to the CPU.

8 Claims, 2 Drawing Sheets

DETECTING FAULTY CPU HEAT SINK COUPLING DURING SYSTEM POWER-UP

BACKGROUND OF THE INVENTION

1. Field of the Invention

The present invention generally relates to cooling systems. More specifically, the present invention is directed to the detection of faulty central processing unit (CPU) heat sink coupling during system power-up.

2. Related Art

With the increase in heat dissipation and the reduction in overall form factors, thermal management of CPUs and other types of integrated circuits has become an increasingly important element of electronic product design.

Heat sinks are devices that enhance heat dissipation from a hot surface, usually the packaging of a heat generating component such as a CPU or other integrated circuit, to a cooling fluid, usually air. Heat sinks typically include a large number of fins to increase the surface area that is in direct contact with air. This allows more heat to be dissipated to control the component operating temperature. Some newer heat sinks also include vapor chambers that are configured to use an internal liquid-to-vapor phase change to spread heat efficiently to air-cooled fins.

The surface of a CPU or heat sink is never entirely flat; if a heat sink is placed directly on a CPU, there will be tiny air gaps between the two. Since air conducts heat poorly, these gaps have a negative effect on heat transfer to the heat sink. Therefore, a heat sink compound with a high thermal conductivity is generally used to fill these gaps, and thus improve heat conductivity between the CPU and heat sink.

In some cases, the heat sink compound must be precisely applied during the attachment of a heat sink to a CPU, and cannot be applied in the field. As such, if the heat sink is removed from the CPU and the heat sink compound is the least bit disturbed, a new heat sink must be supplied, increasing the duration of repair.

A faulty or improperly mounted heat sink will not sufficiently cool a CPU and will likely result in the overheating of the CPU at the most inopportune time. There is a need, therefore, for a technique for predicting this type of fault prior to the overheating of a CPU.

SUMMARY OF THE INVENTION

The present invention is directed to the detection of faulty CPU heat sink coupling during system power-up.

A first aspect of the present invention is directed to a method for detecting faulty central processing unit (CPU) heat sink coupling during system power-up, comprising: monitoring a slope of a CPU temperature rise from initial system power-up; determining if the slope of the CPU temperature rise exceeds an expected value; and in the case that the slope of the CPU temperature rise exceeds the expected value, indicating an existence of a possible fault (PFA) related to a heat sink coupled to the CPU.

A second aspect of the present invention is directed to a system for detecting faulty central processing unit (CPU) heat sink coupling during system power-up, comprising: a system for monitoring a slope of a CPU temperature rise from initial system power-up; a system for determining if the slope of the CPU temperature rise exceeds an expected value; and a system for indicating an existence of a possible fault (PFA) related to a heat sink coupled to the CPU, in the case that the slope of the CPU temperature rise exceeds the expected value.

The illustrative aspects of the present invention are designed to solve the problems herein described and other problems not discussed.

BRIEF DESCRIPTION OF THE DRAWINGS

These and other features of this invention will be more readily understood from the following detailed description of the various aspects of the invention taken in conjunction with the accompanying drawings.

Figure 1:
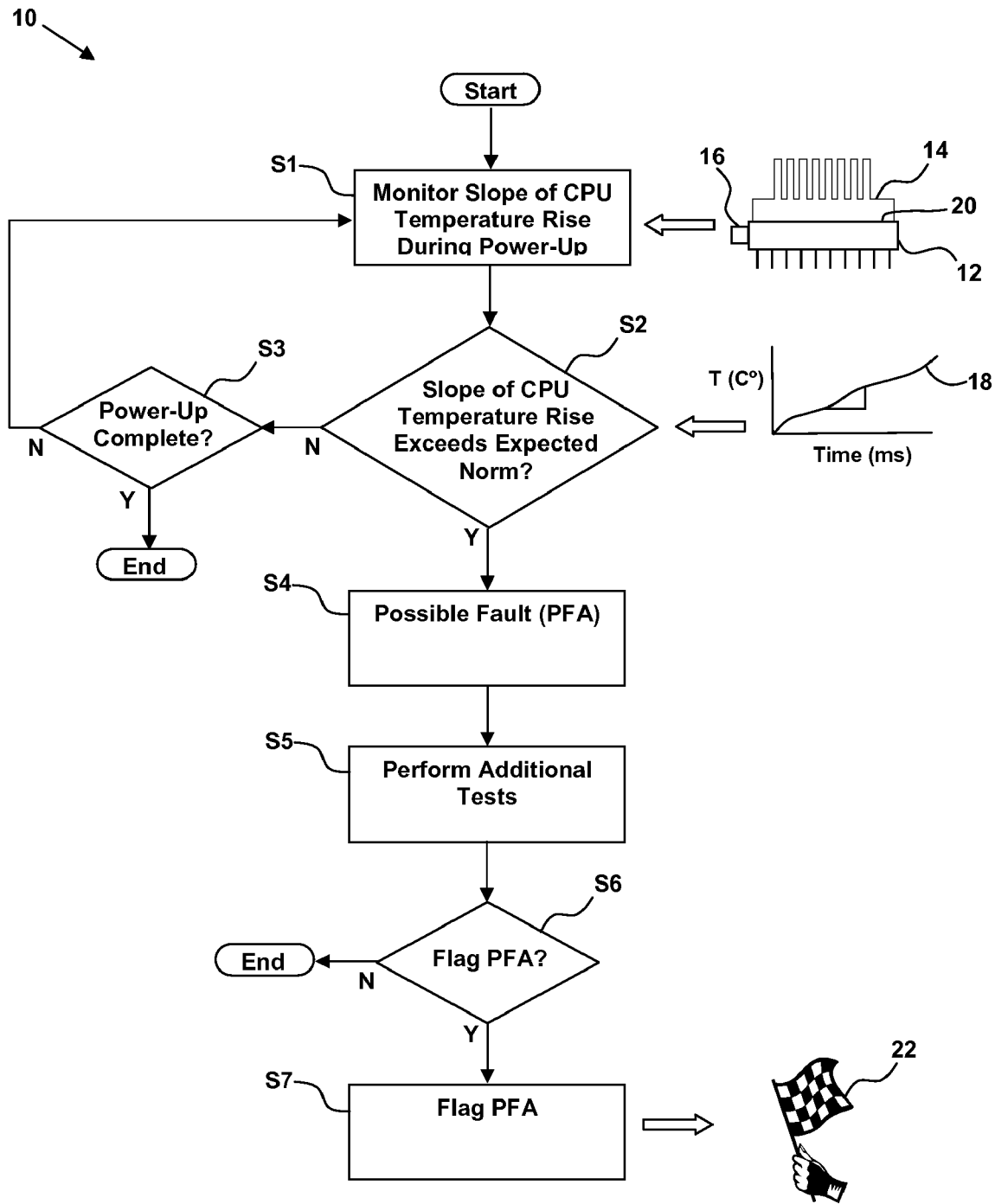
FIG. 1 depicts a flow diagram of an illustrative process for the detection of faulty CPU heat sink coupling during system power-up in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

FIG. 1 depicts a flow diagram 10 of an illustrative process for the detection of faulty CPU heat sink coupling during system power-up in accordance with an embodiment of the present invention.

Under known conditions (air flow, ambient temperature, initial CPU temperature at power-on, etc.), a CPU 12 with a properly mounted heat sink 14 will have a predictable temperature rise during initial system power-up. In accordance with the present invention, the slope of the CPU temperature rise after initial system power-up is monitored in step S1. The temperature of the CPU 12 can be obtained, for example, using one or more CPU temperature sensors 16 mounted directly on the CPU 12 or underneath the CPU 12 on a motherboard. Some CPUs have temperature sensors integrated into their silicon. Other techniques for obtaining CPU temperature readings are also possible.

If the slope of the CPU temperature rise exceeds the expected norm 18 as determined in step S2, it is likely that there is a problem with the heat sink 14 or its interface 20 with the CPU 12. The steeper the slope, the more likely there is a fault related to the heat sink 14. A marginally steep slope with a subsequent over-temperature fault could also indicate a heat sink coupling problem. If the slope of the CPU temperature rise exceeds the expected norm 18, the existence of a possible fault (PFA) is indicated in step S4. The expected norm 18 of the slope of the CPU temperature rise can be determined by monitoring the temperature of one or more of the same combination of CPU 12 and heat sink 14, which are operating normally, or in any other suitable manner. If the slope of the CPU temperature rise does not exceed the expected norm 18 (step S2), and system power-up has been completed (step S3), the process ends. Otherwise flow passes back to step S1.

Upon the indication of a possible fault (PFA) associated with the heat sink 14 in step S4, further tests can be run in step S5 to obtain a more precise reading of the slope of the CPU temperature rise. Testing can be provided, for example, via the system basic input/output system (BIOS), power-on self test (POST) BIOS, baseboard management controller (BMC), etc., or in any other suitable manner. Sufficient data can be collected during such tests to determine in step S6 whether to flag 22 the PFA of the heat sink 14 in step S7. The output of other types of sensors (e.g., airflow, ambient temperature, etc.) can be collected to help determine whether to flag 22 the PFA of the heat sink 14.

If an abnormal slope is detected, the BIOS can delay passing control to the operating system (OS) and run a routine to maximize the temperature of the CPU 12. This type of max load routine can be run until the slope of the CPU temperature rise stabilizes or the temperature of the CPU 12 rises outside of specification.

Flagging a PFA of the heat sink 14 early during power-up provides many advantages, including, for example:
1) It prevents a system from booting to the operating system (OS) until the temperature of the CPU 12 has stabilized and/or is within acceptable operational specifications;
2) It prevents the system from being brought down due to a high temperature condition of the CPU 12, which may cause lost data and/or data corruption; and
3) It provides an early indication (e.g., after a repair, during initial attachment, etc.) that the heat sink 14 was not properly mounted to the CPU 12.

Figure 2:
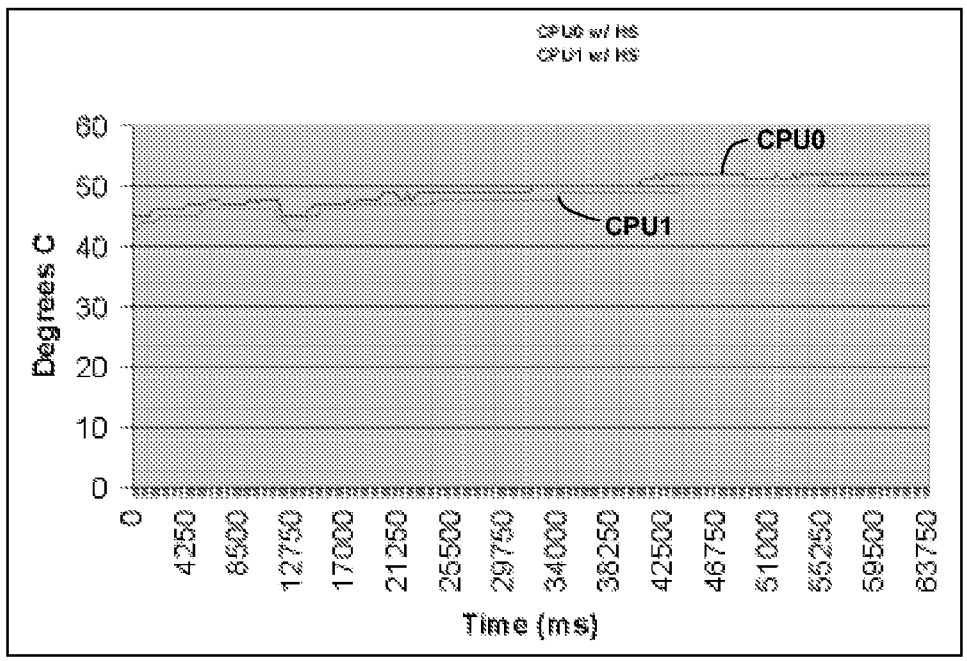
FIG. 2 depicts an illustrative temperature plot of a first CPU with a heat sink and a second CPU with a heat sink, both operating normally.
Figure 3:
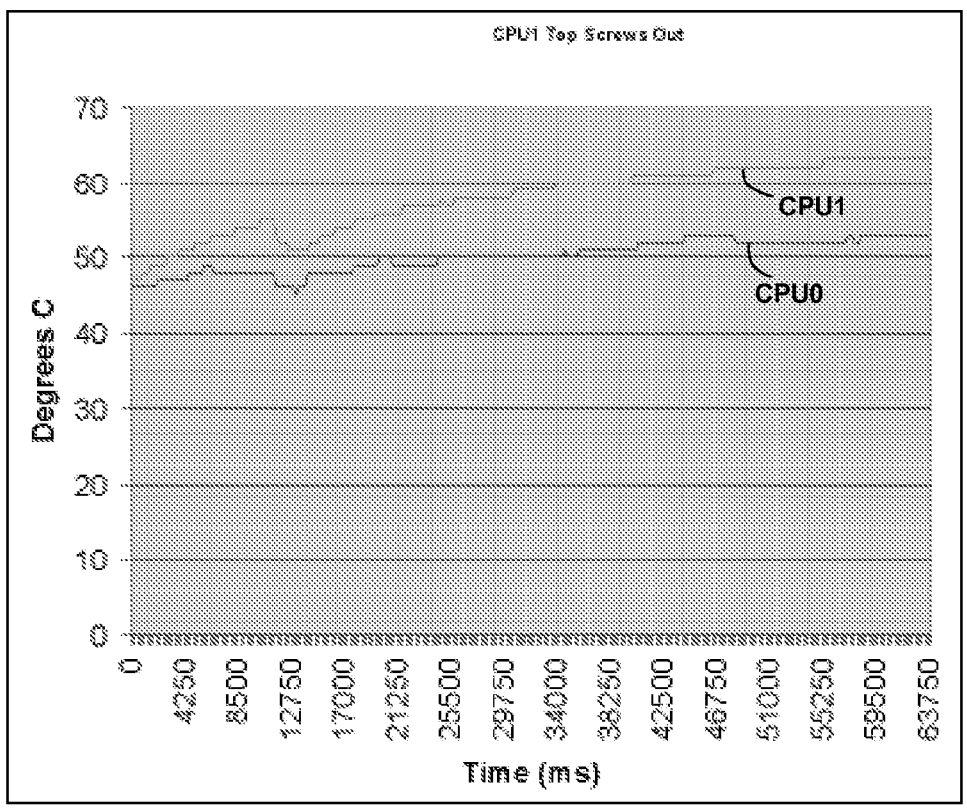
FIG. 3 depicts an illustrative temperature plot of the first and second CPUs of FIG. 2, with the heat sink improperly coupled to the second CPU.

An illustrative temperature plot of a first CPU (CPU0) with a heat sink and a second CPU (CPU1) with a heat sink, both operating as expected, is depicted in FIG. 2. A similar illustrative temperature plot is depicted in FIG. 3. In this case, however, the top coupling screws used to couple CPU1 with its heat sink are missing. Comparing FIGS. 2 and 3, it can be seen that the slope of the CPU temperature rise for CPU1 in FIG. 3 is greater than that for CPU1 in FIG. 2. The present invention would recognize this difference in slope and subsequently indicate that CPU1's heat sink has a PFA.

The present invention or portions thereof can be implemented on any now known or later developed computer system that is capable of executing computer program code. The computer program code can be provided on a computer-readable medium or provided in any other suitable manner.

The foregoing description of the embodiments of this invention has been presented for purposes of illustration and description. It is not intended to be exhaustive or to limit the invention to the precise form disclosed, and many modifications and variations are possible.

What is claimed is:

1. A method for detecting faulty central processing unit (CPU) heat sink coupling during system power-up, comprising:
   monitoring a slope of a CPU temperature rise from initial system power-up;
   determining if the slope of the CPU temperature rise exceeds an expected value; and
   in the case that the slope of the CPU temperature rise exceeds the expected value, indicating an existence of a possible fault (PFA) related to a heat sink coupled to the CPU;
   wherein, upon an indication of the existence of a PFA related to the heat sink, delaying passing of control to an operating system (OS) and running a routine to maximize CPU temperature until the slope of the CPU temperature rise stabilizes or the temperature of the CPU rises outside of specification.

2. The method of claim 1, wherein the PFA related to the heat sink coupled to the CPU indicates at least one of a problem with the heat sink and a problem with a coupling between the heat sink and the CPU.

3. The method of claim 1, further comprising:
   in response to an indication of the PFA, performing additional testing regarding the slope of the CPU temperature rise; and
   selectively flagging the PFA based on results of the additional testing.

4. The method of claim 1, further comprising:
   determining the expected value of the slope of the CPU temperature rise.

5. A system for detecting faulty central processing unit (CPU) heat sink coupling during system power-up, comprising:
   a system for monitoring a slope of a CPU temperature rise from initial system power-up;
   a system for determining if the slope of the CPU temperature rise exceeds an expected value; and
   a system for indicating an existence of a possible fault (PFA) related to a heat sink coupled to the CPU, in the case that the slope of the CPU temperature rise exceeds the expected value;
   wherein, upon an indication of the existence of a PFA related to the heat sink, the system for indicating delays passing of control to an operating system (OS) and runs a routine to maximize CPU temperature until the slope of the CPU temperature rise stabilizes or the temperature of the CPU rises outside of specification.

6. The system of claim 5, wherein the PFA related to the heat sink coupled to the CPU indicates at least one of a problem with the heat sink and a problem with a coupling between the heat sink and the CPU.

7. The system of claim 5, further comprising:
   a system for performing additional testing regarding the slope of the CPU temperature rise in response to an indication of the PFA; and
   a system for selectively flagging the PFA based on results of the additional testing.

8. The system of claim 5, further comprising:
   a system for determining the expected value of the slope of the CPU temperature rise.

* * * * *